US009015020B2

(12) United States Patent
Lontka

(10) Patent No.: US 9,015,020 B2
(45) Date of Patent: Apr. 21, 2015

(54) METHOD AND SYSTEM FOR TESTING A BUILDING CONTROL SYSTEM

(75) Inventor: Karen Lontka, Randolph, NJ (US)

(73) Assignee: Siemens Industry, Inc., Alpharetta, GA (US)

(*) Notice: Subject to any disclaimer, the term of this patent is extended or adjusted under 35 U.S.C. 154(b) by 1543 days.

(21) Appl. No.: 12/148,868

(22) Filed: Apr. 22, 2008

(65) Prior Publication Data

US 2008/0262816 A1  Oct. 23, 2008

Related U.S. Application Data

(60) Provisional application No. 60/913,311, filed on Apr. 23, 2007.

(51) Int. Cl.
| G06F 17/50 | (2006.01) |
| G06F 9/44 | (2006.01) |
| G06F 13/10 | (2006.01) |

(Continued)

(52) U.S. Cl.
CPC ............ G05B 17/02 (2013.01); G06F 17/5004 (2013.01); G06F 17/30575 (2013.01); G06F 17/5009 (2013.01); G05B 15/02 (2013.01); H04L 41/145 (2013.01); G08B 25/14 (2013.01); G06F 3/0482 (2013.01); G05B 2219/2642 (2013.01)

(58) Field of Classification Search
CPC ............ G06F 17/5004; G06F 17/5009; G06F 17/30575; G06F 3/0482; G05B 17/02; G05B 15/02; G08B 25/14; H04L 41/145
USPC .................................. 703/13, 20, 24
See application file for complete search history.

(56) References Cited

U.S. PATENT DOCUMENTS

| 4,162,489 A | 7/1979 | Thilo et al. | |
| 4,567,557 A * | 1/1986 | Burns | 700/16 |

(Continued)

FOREIGN PATENT DOCUMENTS

| DE | 4421244 | 12/1995 |
| EP | 0494788 | 7/1992 |
| TW | 200421057 A | 10/2004 |

OTHER PUBLICATIONS

Steven T. Bushby, Non Patent Publication "Using the Virtual Cybernetic Building Testbed and FDD Test Shell for FDD Tool Development", NISTIR6818 Oct. 2001.*

(Continued)

Primary Examiner — Omar Fernandez Rivas
Assistant Examiner — Angel Calle

(57) ABSTRACT

A building control system comprises a central control station and at least one control panel connected to the central control station over a network. At least one loop is connected to at least one control panel. The at least one loop comprises a plurality of installed building control devices connected in an electrical circuit. A simulator is also connected to the network and configured to simulate the operation of a plurality of uninstalled building control devices for the building control system. The simulator is further configured to communicate over the network with the plurality of installed building control devices. Simulation of the operation of the uninstalled building control devices occurs simultaneously with the communication between the installed building control devices and the simulator. Accordingly, the simulator may be used to test the entire building control system during the process of installation at a facility.

17 Claims, 8 Drawing Sheets

(51) Int. Cl.
  *G06F 13/12*    (2006.01)
  *G06F 9/455*    (2006.01)
  *G05B 17/02*    (2006.01)
  *G06F 17/30*    (2006.01)
  *G05B 15/02*    (2006.01)
  *H04L 12/24*    (2006.01)
  *G08B 25/14*    (2006.01)
  *G06F 3/0482*   (2013.01)

(56) References Cited

U.S. PATENT DOCUMENTS

| | | | |
|---|---|---|---|
| 6,389,331 B1 | 5/2002 | Jensen et al. | |
| 6,829,513 B2* | 12/2004 | Piersanti et al. | 700/83 |
| 6,907,300 B2* | 6/2005 | O'Mahoney et al. | 700/17 |
| 7,049,951 B2 | 5/2006 | Rhodes et al. | |
| 7,054,793 B2* | 5/2006 | Moritz et al. | 703/1 |
| 7,716,012 B2* | 5/2010 | Bickel | 702/179 |
| 2004/0051739 A1 | 3/2004 | Schmickley et al. | |
| 2005/0259374 A1* | 11/2005 | Lai | 361/90 |
| 2008/0122575 A1* | 5/2008 | Lavian et al. | 340/3.1 |

OTHER PUBLICATIONS

P. Riederer, Non Patent Publication, "A virtual laboratory for the test of terminal controllers for electric heating system following a draft European standard", Building simulation 2005.*

Michael Iuliano, "Simulation and Visualization Using a Remote Database", 2001.*

Peng Xu, Philip Have, and Joe Deringer, "A simulation based testing and training environment for building controls", SimBuild 2004.*

P. Riederer, Non Patent Publication, "Development and Quality improvement of HVAC control Systems in virtual laboratory", Building simulation 2001.*

International Search Report dated Jul. 23, 2008 for Application No. PCT/US2008/005238.

English translation of the corresponding Taiwanese office action with cited reference is submitted for convenience and not as prior art. Citation attached is an English translation of abstract.

* cited by examiner

METHOD AND SYSTEM FOR TESTING A BUILDING CONTROL SYSTEM

CROSS-REFERENCE TO RELATED APPLICATIONS

This application claims the benefit of U.S. provisional patent application Ser. No. 60/913,311, filed Apr. 23, 2007.

FIELD

This invention relates to the field of building control systems, and more particularly to a method and system for evaluating and testing an entire building control system during installation of the system.

BACKGROUND

Large building systems utilize numerous interconnected devices which together act to control a particular function within the building. Fire safety systems and HVAC systems are two examples of building control systems that are commonly found in modern facilities. Fire safety systems typically include various interconnected building control devices, such as smoke detectors, pull levers, audio alarms, visual alarms, valves and other devices that collectively provide for fire safety within the building. Similarly, HVAC systems include building control devices such as thermostats, heaters, air conditioners, vents, humidifiers and other devices that are used to control temperature and environment within a building. These large building systems typically employ data networks to transmit information, to one or more "control" locations in which alarm status and other system status information may be monitored.

While building control systems are interconnected to form a unit once the building is complete, the various devices and components of such building control systems can not be installed at the same time during construction of the facility. In particular, the various components of each building control system are typically installed piecemeal, over time, with installation of the components in various building zones dependent upon the completion of other construction in such zones.

In view of the piecemeal installation process, a typical job site problem time crunch evolves from the fact that the building control system devices and related equipment does not get installed, debugged & commissioned until very late in a building project. For example, with respect to fire safety systems, the fire safety system is slowly built up over time as technicians gain access to portions of a building to work or as hardware is received from the factory. As a result, only small portions of the fire safety system can be tested at a time. The full run-time logical interaction of the fire safety system can not be tested & evaluated until all hardware is installed. Historically this tends to be a final obstacle for obtaining a certificate of occupancy (temporary or permanent). Quite often in large installations performance problems & logical design errors are not found until the full system test can start. At that point, resolving them can be costly and result in time delays as well as contract fines/penalties.

In view of the above, it would be advantageous to provide a method for testing an entire building control system for a particular facility before installation is complete at the job site. It would also be advantageous if such a method for testing a building control system could be used on the job site during the installation process, thus allowing problems with the logical design or system software to be resolved as early as possible, and allowing a maximum amount of time for investigation and resolution of such problems.

SUMMARY

A building control system, such as a fire safety system, comprises a central control station and at least one control panel connected to the central control station over a network. At least one loop comprising plurality of installed building control devices is connected to the at least one control panel. A simulator is also connected to the network and configured to simulate the operation of a plurality of uninstalled building control devices for the building control system. The simulator is further configured to communicate over the network with the plurality of installed building control devices. Simulation of the uninstalled building control devices occurs simultaneously with the communications with the installed building control devices. Accordingly, the simulator may be used to test the entire building control system even during the process of installation at a facility.

The simulator is used in association with a method of testing a building control system being installed in a facility. The method comprises, installing a first portion of the plurality of building control devices at the facility while a second portion of the plurality of building control devices remain uninstalled at the facility. The method further comprises delivering identification information concerning the plurality of building control devices to the simulator program. In at least one embodiment, the identification information is provided by a site specific database generated by a system configuration tool, and the database is imported into the simulator program provided at the facility. After the identification information is delivered to the simulator, installation information concerning the plurality of building control devices is also delivered to the simulator program. The installation information indicates which of the plurality of building control devices have been installed at the facility and which of the plurality of devices have not been installed. After receiving this information, the simulator program is executed to test the entire building control system. During execution, the simulator program simulates the performance of the second portion of the plurality of building control devices which remain uninstalled at the facility but the simulator program does not simulate the performance of the first plurality of building control devices which are installed at the facility. Instead, the simulation program handshakes with all of the installed building control devices, providing communications to these installed devices, and receiving communications from these installed devices, when applicable. Accordingly, a method is disclosed that provides for pre-installation testing of an entire building control system running under simulated full load.

The above described features and advantages, as well as others, will become more readily apparent to those of ordinary skill in the art by reference to the following detailed description and accompanying drawings. While it would be desirable to provide a system and/or method of testing a building control system that includes one or more of the foregoing or other advantageous features as may be apparent to those reviewing this disclosure, the teachings disclosed herein extend to those embodiments which fall within the scope of the appended claims, regardless of whether they include the above-mentioned features accomplish or provide one or more of the advantages mentioned herein.

DESCRIPTION

The embodiments disclosed herein will be described with respect to a fire safety system and related apparatus and methods. However, the invention is not limited to fire safety systems, and the exemplary and other various embodiments may be applied to any building system within the scope of the attached claims.

Figure 1:
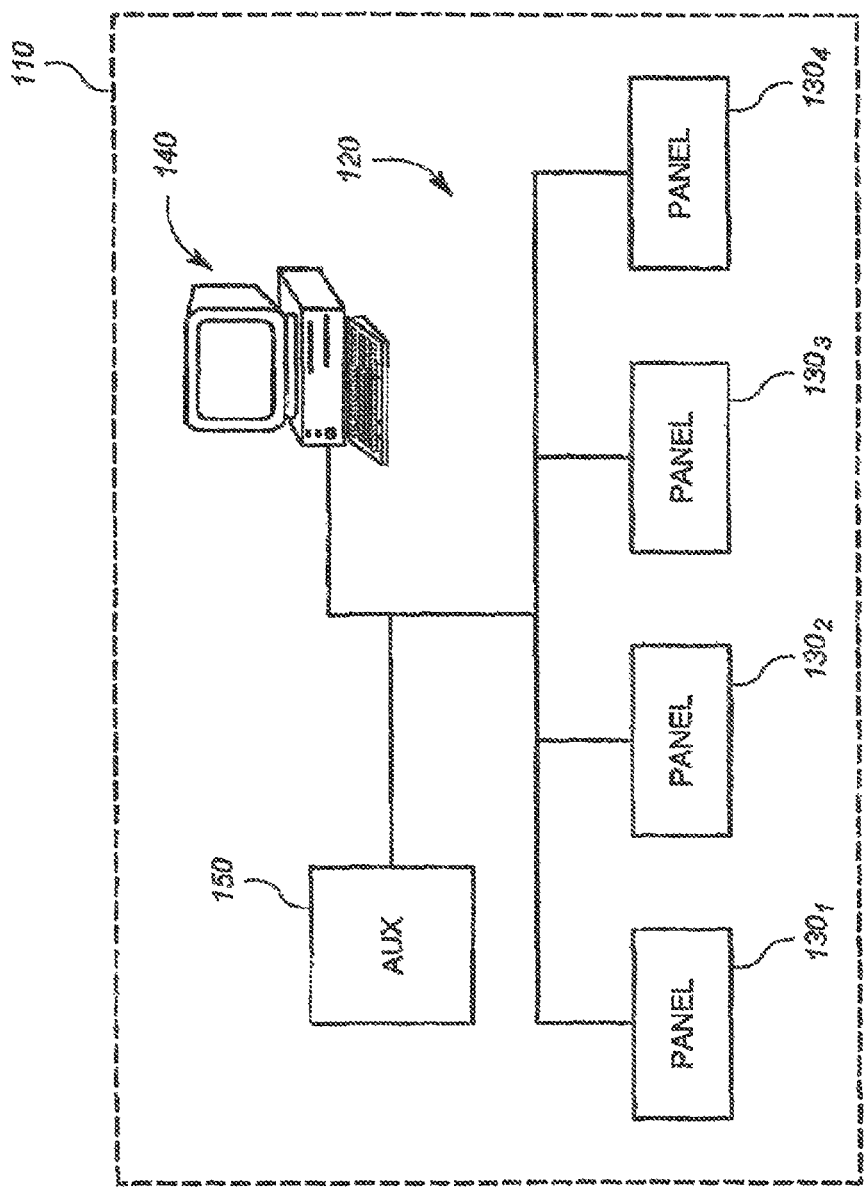
FIG. 1 shows a block diagram of an exemplary fire safety system installed at a facility.
Figure 2:
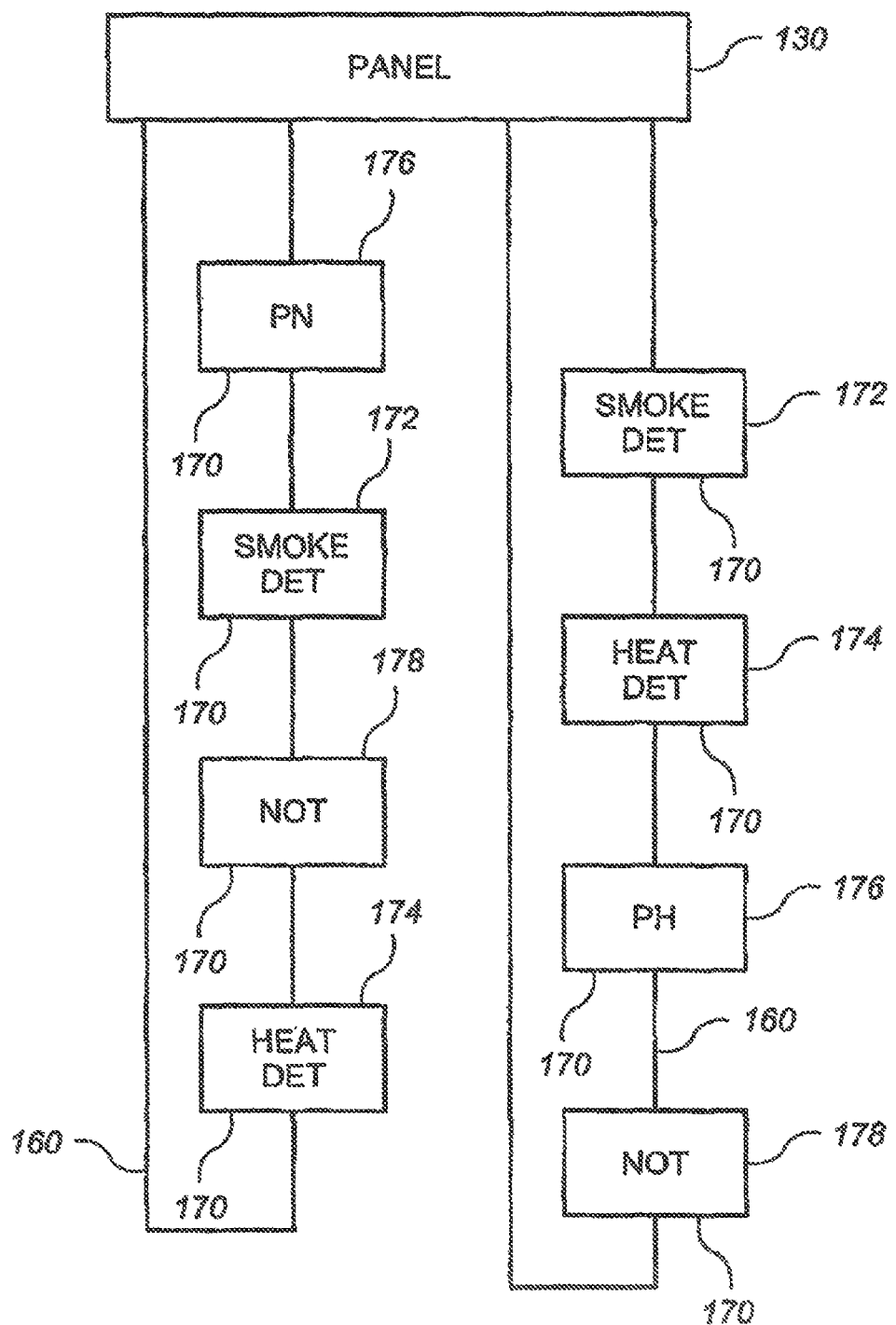
FIG. 2 shows a block diagram of hardware devices/modules connected to a control panel of the fire safety system of FIG. 1.

FIGS. 1-2 show an exemplary fire safety system 120 installed in a building or other facility 110. The fire safety system is an integrated system that includes a plurality of control panels $130_{1-n}$. The plurality of control panels $130_{1-n}$ may be operably connected to at least one central control station 140. The control panels 130 and the control station 140 may also be operably connected to one or more auxiliary devices 150, such as a printer or other network device.

As shown in FIG. 2, each control panel 130 is connected to one or more hardware loops 160. Each loop 160 includes one or more fire safety devices 170 that perform any of a number of fire safety system functions. These functions may include, for example, smoke detection, fire detection, audible and visible notification of alarms, local control and communication, and other functions known in the art. The devices shown in the loops 160 of FIG. 2 include smoke detectors 162, heat detectors 164 manual pull handles 166, and notifiers 168 (including audible and visual alarms such as bells, sirens, lights, etc.). It will be recognized that different loops 160 will include different devices 170, and no loop needs to include any one particular device. The plurality of building control devices in each loop are connected in a single electrical circuit, each of the plurality of building control devices configured receive power provided from the associated control panel and communicate with the control panel (i.e., receive information from or provide information to the control panel).

The fire safety system 120 is generally operable to perform the detection and notification functions normally associated with fire alarm systems. As one of the functions, the fire safety devices 170 are operable to communicate event messages to the control panels 130 and then on to the central control station 140 over one or more communication networks. An event message typically communicates information regarding a non-normal condition. The event messages may relate to detected fire conditions, communication problems, equipment trouble, or other information that indicates that equipment within the fire safety system 120 requires action or further review. An event message may also include a "return to normal" message indicating that the non-normal condition referenced in a previously received event message has been resolved.

With particular reference now to FIG. 1 the fire safety system 120 is shown in a network environment 122 including a plurality of fire control panels $130_{1-n}$ connected to a central control station 140. Each fire control panel 130 may operate in a the network environment 122 using logical connections to one or more other fire control panels and the central control station 140. The network environment may be, for example, a LAN, a WAN, an intranet or the internet. The one or more fire control panels 130 and the central control station 140 are connected through a predetermined protocol which is dictated by the nature of the interconnect method and the panel types. Examples of protocols that may be used include the H-Net, M-Net and X-Net protocols as will be recognized by those of skill in the art. In one exemplary embodiment, panel to panel communications are on XNET while communications between modules within a panel are on HNET.

The network of FIG. 1 includes at least one PC-based network monitoring and control location in the form of central control station 140. This PC 140 allows an operator to see events in the network 122 and also display graphics relative to the network 122 and individual control panels 130. The PC also allows an operator to remotely control any or all of the fire control panels 130. Each of the fire control panels 122 in the network operate independently. Accordingly, the network 122 depicted in FIG. 1 will still operate if the PCs 140 is not operational. Furthermore, although central control station 140 is shown within the confines of the facility 110 in FIG. 1, in other embodiments, the central control station 140 may be located outside of the facility 110 and tied into the network 122 via a remote connection.

When one panel $130_1$ of the fire safety system 120 detects a system event from one of the fire safety devices 170, the panel $130_n$ will broadcast the event to all of the other control panels $130_{1-n}$. The other control panels $130_{1-n}$ decide if that system event will cause a change on any of their local outputs. However in an alternative embodiment, the fire safety system 120 may be configured such that one panel may control another panel's outputs directly.

Figure 3:
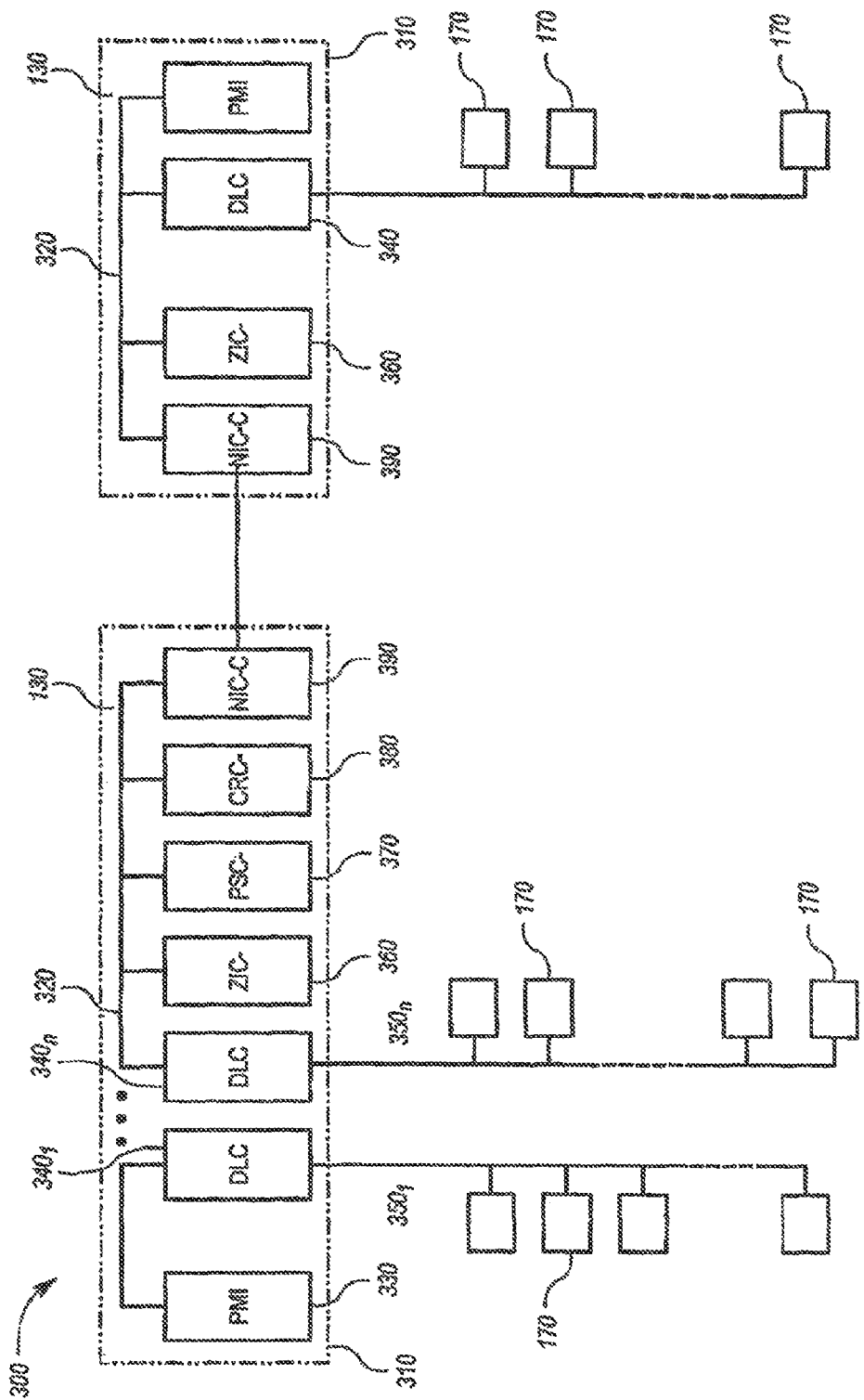
FIG. 3 shows a block diagram of the components in two of the control panels of the fire safety system of FIG. 1.

Referring now to FIG. 3, two exemplary fire control panels 130 are shown as part of a fire safety system 300. The fire control panels 130 may be utilized as part of the fire safety system 120 shown in FIGS. 1 and 2. Each fire control panel 130 is comprised of an enclosure 310, such as a control panel cabinet. The fire control panel 130 further comprises a bus 320, or other communications hardware or software, for communicating information and signals. In addition, the fire control panel comprises a person-to-machine user interface (PMI) 330 coupled to bus 320. The PMI 330 is used to view system information and to input control data.

Each fire control panel 310 comprises one or more device loop controllers $340_1$-$340_n$ coupled to the bus 320 for controlling a loop of devices $350_1$-$350_n$. Each device loop controller 340 is the central communication point for fire safety devices 170, including smoke detectors, heat detectors, manual pull stations and/or other devices such as relay bases, audible bases and remote lamps in any combination on the detector electrical loop 350. Each device loop controller 340 communicates with these device loops 350 via a protocol. Each device loop controller 340 may support a plurality of devices (e.g., 252) in one device loop 350. Each device loop controller 340 initializes, operates, and maintains all devices 170 residing on the device loop 350 and communicates all relevant device and event information, such as alarms and troubles, to the interface 330. By adding further device loop controllers 340 in system 300, the system 330 can be expanded to support thousands of intelligent detectors and devices spread across a flexible number of device loops 350.

The control panel 310 further comprises zone indicating module 360 coupled to bus 320 which provides power to and communications with first safety devices 170 (e.g., smoke detectors, pull handles, alarms, strobes, or other building control devices) in the system 300.

Each control panel 310 also comprises power supply module 370 coupled to bus 320 for supplying power to modules operably connected to bus 320. The system further includes control relay module 380 connected to bus 320. This control relay module 380 provides multiple relays with which to operate the building control devices (e.g., bells, horns, strobes, etc.).

Each control panel further includes one or more interface modules 390 coupled to bus 320. The interface module 390 provides network communications between different control panels 130 in the system 300. The interface module 390 supervises the system 300 to insure proper operation. Any faults that are detected by the interface module 390 are reported to the interface 330 for annunciation. In addition, the interface module 390 has diagnostic LEDs (not shown) that indicate which faults have been found. Individual LEDs are included for Loop A and Loop B faults, as well as an LED for complete failure of the system 300. The interface module 390 can also be configured to perform ground fault detection in the system 300. Exemplary fire control panels include the XLS, MXL and MXL IQ control panels provided by Siemens.

Returning to FIG. 1, during installation of the fire safety system 120 at a facility 110, various sections and components of the fire safety system are installed at different times. For example, installation of the fire control panel 130₁ and its connected building control devices 170 which cover one zone of a building may be completed several weeks before fire control panel 130₂ and its connected building control devices 170 which cover another zone of the building. As discussed previously, in these situations, it would be advantageous to provide a system and method capable of testing the complete fire safety system even though the installation at the facility is incomplete.

Before a fire safety system 120 such as the one shown in FIGS. 1-3 is installed, the fire safety system is first planned and configured for the specific facility 110 using a system configuration tool. An exemplary system configuration tool is described in U.S. Pat. No. 6,829,513, the contents of which are incorporated herein by reference in their entirety. Exemplary configuration tools include the "CSGM" and "ZEUS" configuration tools provided by Siemens.

With the use of a configuration tool, a user may graphically design a facility specific system configuration, view multiple system interrelationships such as hardware or logical connectivity, assign devices to convenient intuitive groups by location or other criteria, visually program system behavior and compile and transfer the completed configuration to a system control panel, such as the shown in FIG. 1. The configuration tool may provide for different views of the fire safety system. For example, the configuration tool may provide for tree views of the fire safety system where elements (such as components, logic functions and geographic groups) are represented by icons and linked by dotted lines to show their place in the view's hierarchy. After creating one or more different views, the views are compiled by the configuration tool which creates a site specific database of all the components of the fire safety system 120 and the interrelationship between such components. The compiled database may then be delivered to the control station 140 or to the various panels 130 installed at the facility.

The control station or other PC connected to the network 122 is equipped with a PC based simulator for the building control system 120. The simulator program is retained in the PC's memory or other storage space, such as a hard drive. The simulator program is operable to simulate the actions and responses of the control panels 130 and the hardware devices 170 connected to the control panels. The existence of the simulator for the building control program allows complete system performance, logic design, and other aspects of the building control system 120 to be evaluated and debugged prior to or in parallel with the installation of the actual hardware at the job site.

Figure 4:
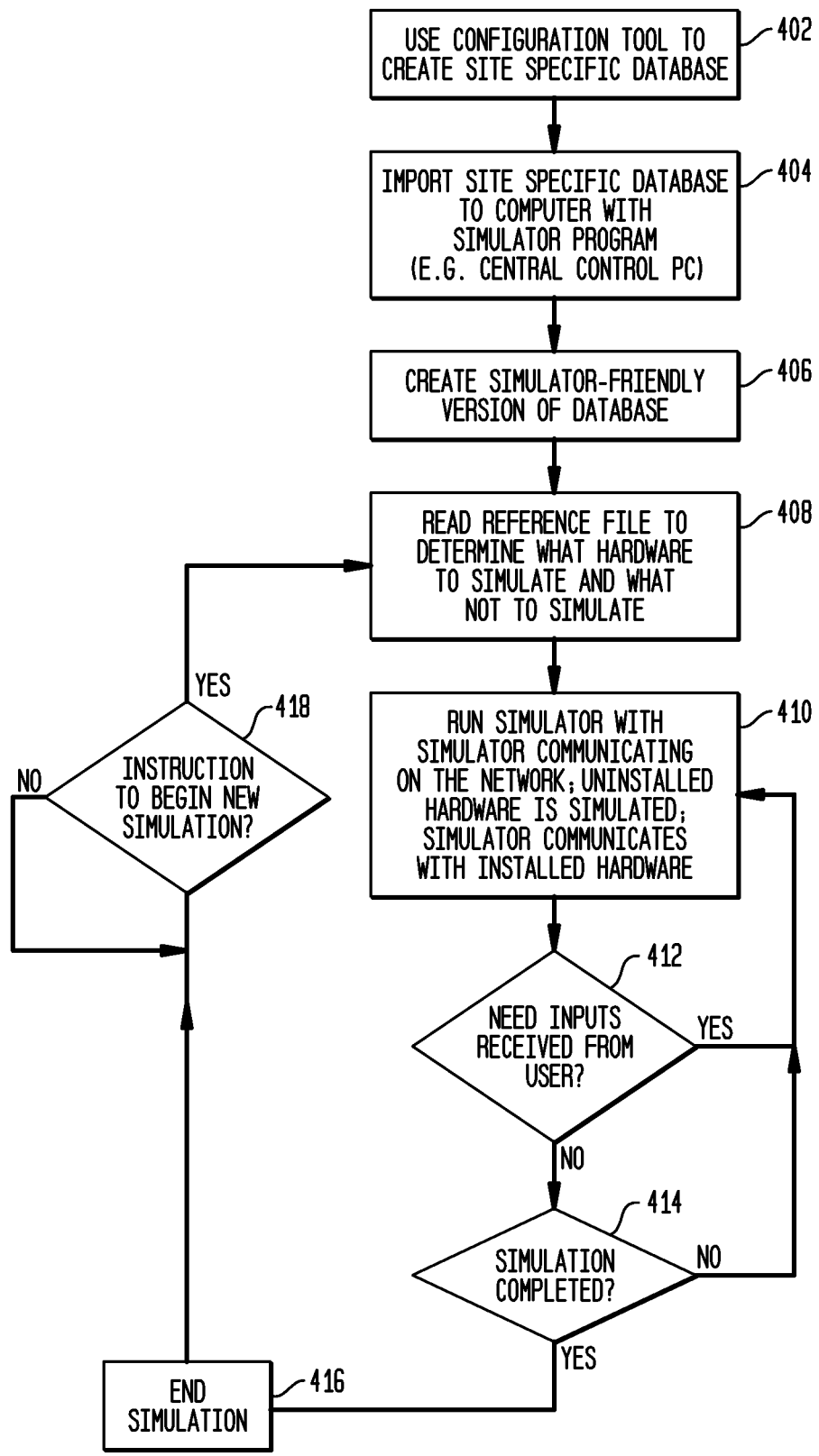
FIG. 4 shows a flowchart of a method for simulating the fire safety system of FIG. 1 while the components of the fire safety system are still being installed.

With reference now to FIG. 4, a method is shown for the testing of a building control system using a simulator. The method begins at step 402 with the creation of a site specific building control system database through the use a configuration tool, as discussed above. This site specific configuration database is then imported to the control station 140 (or other network PC) equipped with the PC based simulator, as shown in step 404. The simulator only requires information concerning the equipment for the building control system 120 and does not require information concerning the logical design of the building control system. Thus, the site specific, database generated by the configuration tool provides all the data needed by the simulator to run a simulation. Advantageously, the step of importing the database to the control station 140 requires only a small effort by a technician. Furthermore, if the simulator is provided on the same PC as the control station 140, this step of importing the configuration database is required anyway.

After the control station 140 receives the site specific configuration database, the database is manipulated by the simulator program to create a simulator-friendly version of the database, as shown in step 406. In at least one embodiment the simulator program is configured to read compiled configuration databases directly. In other embodiments, the configuration tool may have the ability to export required data for the simulator program with the desire/defined tags.

Once the simulator friendly version of the database has been generated, the simulator is ready to test the system. As mentioned previously, the simulator is specifically designed to perform testing when at least some of the hardware for the building control system has yet to be installed. Thus, as indicated in step 408, the simulator is equipped with its own reference file which instructs the simulator program to simulate certain hardware and not simulate other hardware. In at least one embodiment, the instruction to simulate or not simulate a particular piece of hardware is provided via an extension text file that resides in the same PC directory as the database file used by the simulator. The extension text file contains a list of hardware addresses that the simulator is not to simulate via script language. For example, the tag @EXCLUDE=12 means the simulator should not simulate the module at network address 12 if it finds it in the database. Accordingly, the simulator is adapted to allow installed hardware and uninstalled hardware to be accounted for during any simulation. As additional hardware is installed during the construction process, the simulator may be easily updated by simply adding any recent hardware installations to the simulator reference file (i.e., the extension text file).

Once the simulator is connected to the network 122, the program is started and the simulator is directed which database it is to simulate, the PC application begins communicating on the network, as noted in step 410. As discussed above, the system configuration tool is used to input the inventory and properties of the components of the system (i.e., building control devices) and create the logical interconnections between the elements for use during the simulation process. In addition, the system control panels 130 execute the logic to realize the required operations within the facility. The simulator is then used to provide the simulation of the components of the system. During operation, the simulator will input the configuration generated by the configuration tool and extract all component information. The simulator then instantiates the proper elements needed to satisfy the requirements of the panel under test. The simulator can be instructed to selectively imitate any combination of elements from the configuration. The simulator provides communications for uninstalled hardware as if it were installed. For example, if a particular module would typically include an application delay, the simulator simulates the module application delay. At the same time, the simulator does not attempt to simulate installed hardware. Instead, installed hardware handshakes with the simulator program, with the simulator transmitting signals to and receiving signals from the installed hardware during the simulation process. While a hardware device may be imitated during one simulation, it may be replaced during later simulations by the true physical device. Accordingly, the simulator allows for a mixture of simulated and physical components to coexist. The status of the various modules/devices during the simulation process is shown on a user interface (e.g., the display screen of the central control station 140). Accordingly, the user has the ability to view the entire simulation process and obtain data on the status of the building control system. Based on the performance of the control panels and building control devices (installed and uninstalled) during the simulation process, the user has the ability to analyze the building control system and determine whether modifications to the system are required. Advantageously, this analysis of the complete building control system may be performed before all the components of the system are installed at the facility.

Block 412 of FIG. 4 shows that various inputs may be input by the user during the simulation process. For example, the user is provided with the opportunity to simulate inputs for uninstalled devices, monitor outputs for both installed and uninstalled devices, and/or create troubles or other issues on the components being simulated. This is accomplished using the simulator's user interface, which includes a unique window for each module type. Exemplary screens for the simulator's user interface will be explained in further detail below.

As shown in blocks 412 and 414 of FIG. 4, the simulator monitors the status of existing simulations as well as new inputs from the user to determine if a simulation session is complete. The user inputs may be provided before the simulation begins and may also be interactive with the simulation. For example, if the user wants to observe the system reaction to a given initiating device (e.g., a smoke detector), then the user can energize it by a mouse click on the icon representation of the device on the display. As new inputs are received, the simulator continues to run the simulation program, receiving various inputs and outputs and displaying the inputs and the outputs on the user interface. Once the user indicates that the simulation is complete, the simulation is ended in step 416. The simulator program then waits for an instruction that a new simulation is to start, as noted at step 418. Before any new simulation starts, the simulator again returns to step 408 and determines what hardware to simulate and what hardware not to simulate based on the contents of the reference file.

Figure 5:
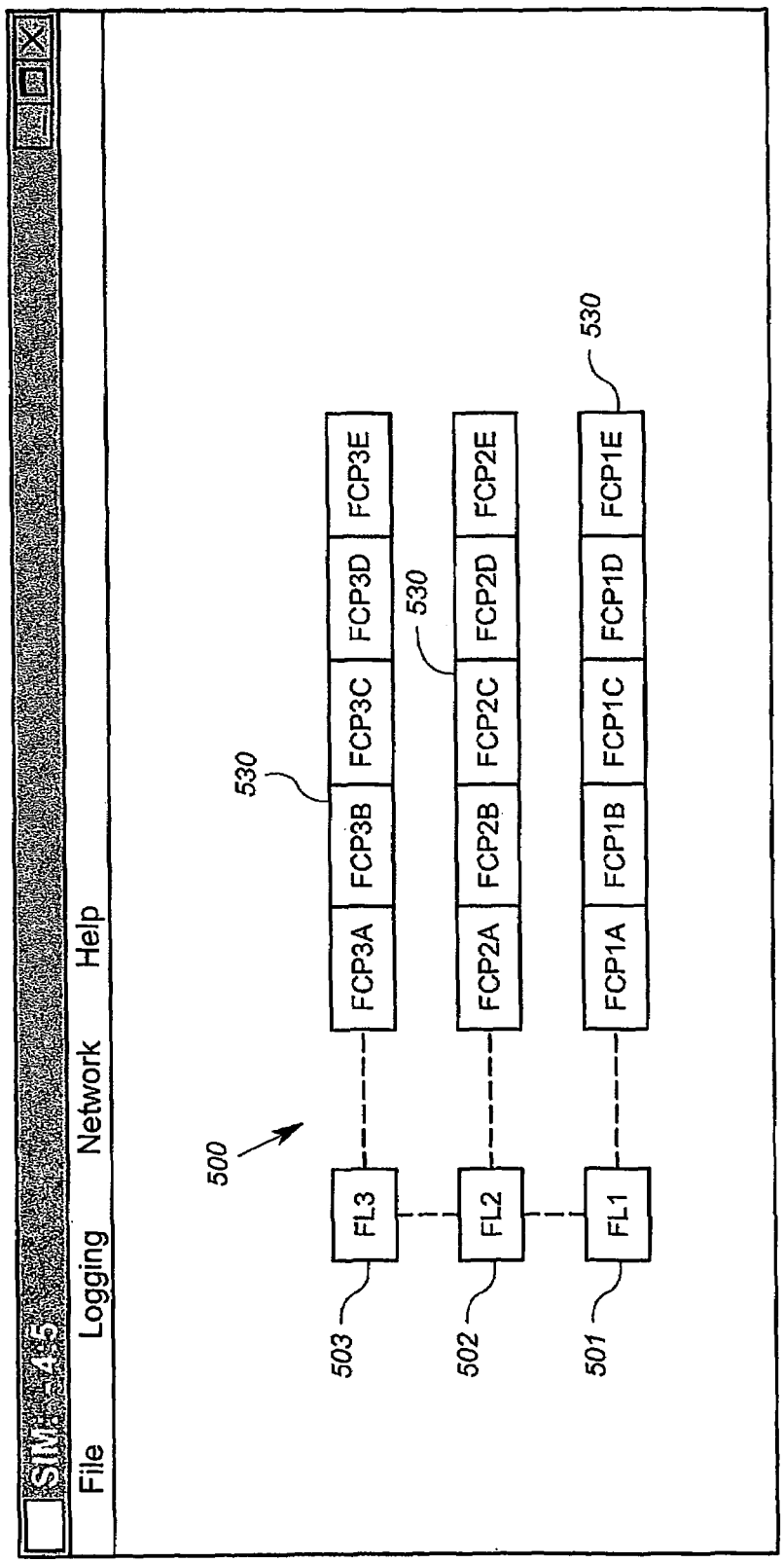
FIG. 5 shows an exemplary screen shot of the fire safety system network provided by the simulator used in the method of FIG. 4.
Figure 6:
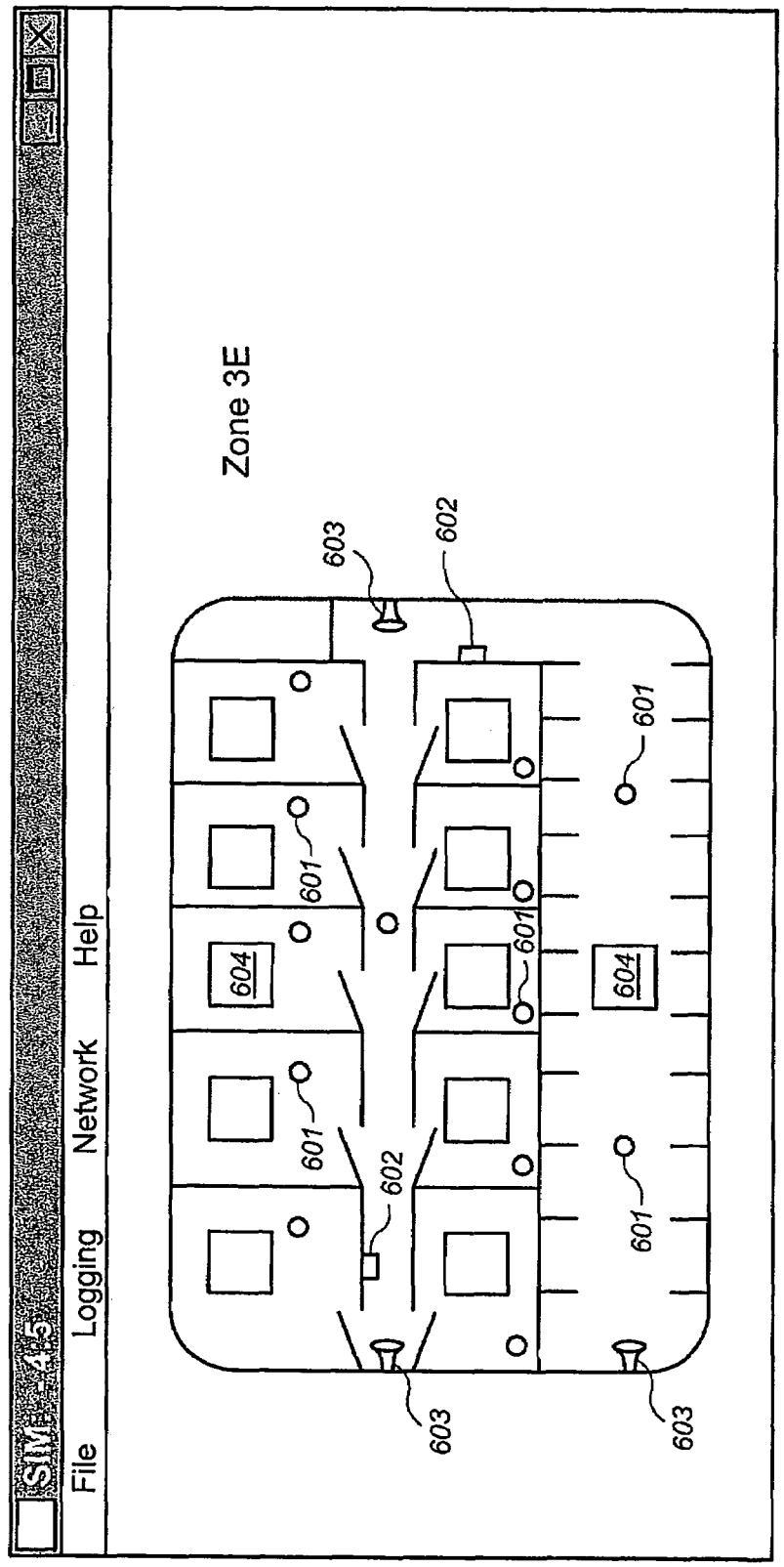
FIG. 6 shows an exemplary device/module layout screen provided after a zone from the screen of FIG. 5 is selected.
Figure 7:
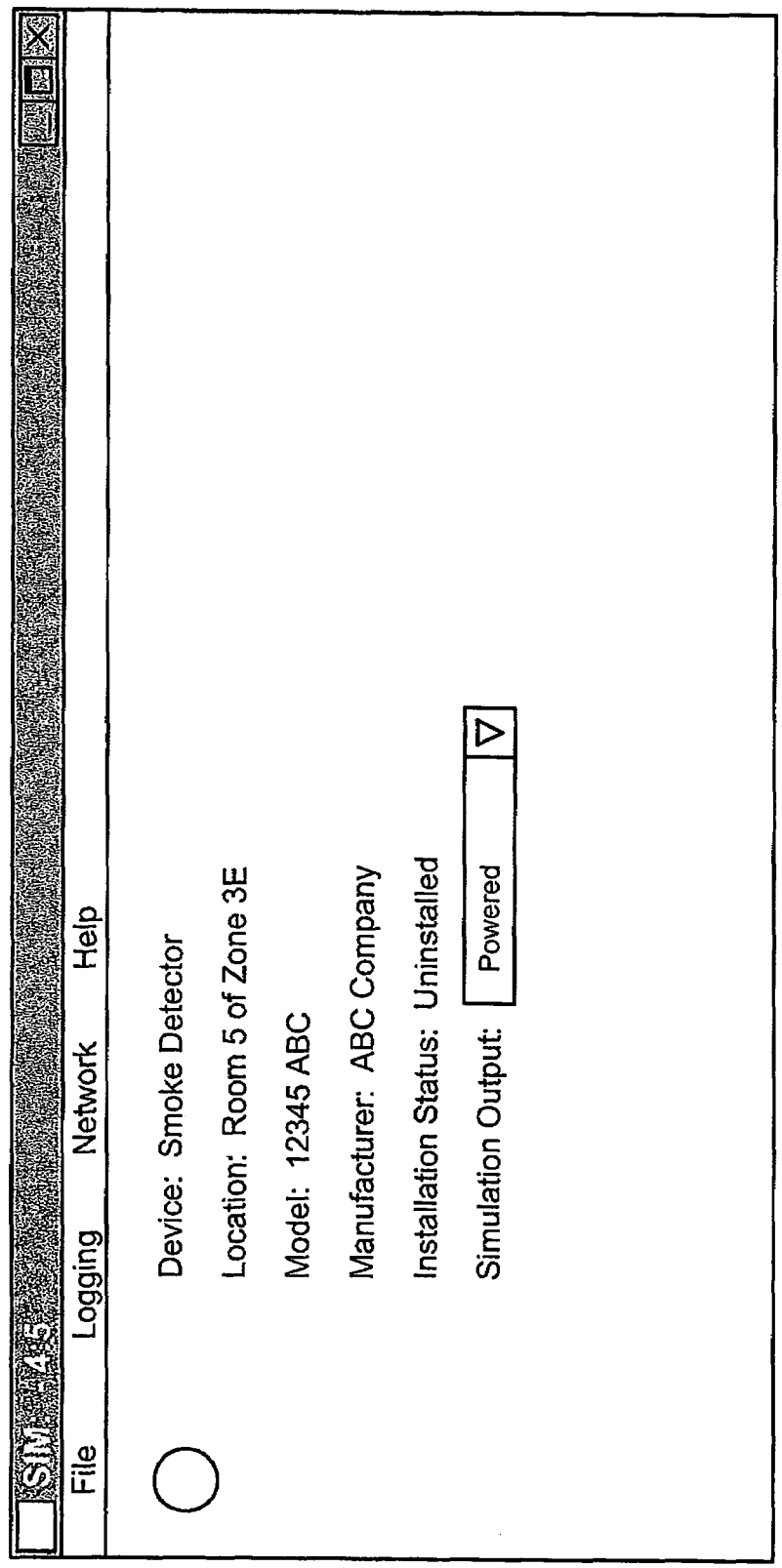
FIG. 7 shows an exemplary module specific implementation window provided after one of the modules of the screen of FIG. 6 is selected.

With reference now to FIGS. 5-7, exemplary user interface screen shots are provided. In the embodiment shown in FIG. 5, the simulator's user interface shows an exemplary network map 500 for a three story building control system. The network map shows the three floors 501, 502, 503 of the building, with five fire control panels 530 on each floor. Each fire control panel covers a zone on the particular floor of the building.

If the user selects (e.g., by clicking with a mouse) on one of the fire control panels 530, the user is presented with more information concerning the zone of the building covered by that particular fire control panel 530. For example if the user selects fire control panel FCP3E, the user is presented with a diagram of zone 3E, as shown in FIG. 6. Zone 3E includes a plurality of rooms with a plurality of hardware devices positioned in the rooms and hallways of Zone 3E. Different icons or alphanumeric characters are shown in the different rooms and hallways of FIG. 6 to represent different hardware devices/modules positioned within the zone. For example, in FIG. 6 icon 601, (a circle) represents a smoke detector, icon 602 (a bracket) represents a pull handle, and icon 603 (a horn) represents an audible alarm.

The user may select a building control device shown in FIG. 6 in order to open a module specific implementation window. An exemplary module specific implementation window is shown in FIG. 7. Within that window, the user may create alarms, troubles, look at device types, determine output state, etc., depending on the device type. In addition, for simulated devices, the user may change the status of a device to see the effects on the rest of the system. For example, if the device is a smoke detector, the user may indicate that smoke has been detected at this device. The user may then see what effect this has on the rest of the system.

It will be recognized that the graphical user interface of FIGS. 5-7 is but one embodiment, and one of skill in the art could implement many other embodiments. For example, in FIG. 6, the boxes 604 in each room could be buttons that may be selected to find out additional information about devices in that room or take the user to a module specific implementation window for the devices in such room.

Figure 8:
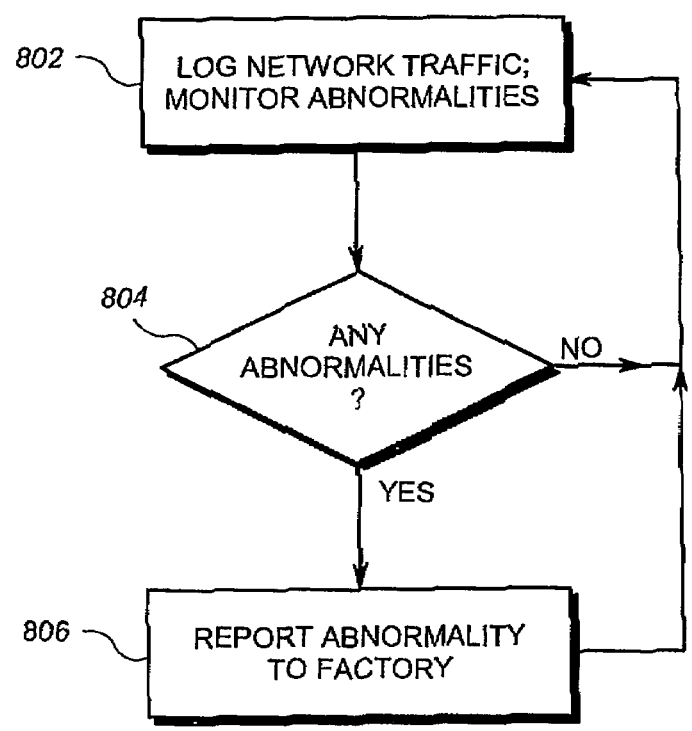
FIG. 8 shows a flowchart of the network logging capabilities of the system of FIG. 1.

As set forth in FIG. 8, the simulation tool also has network logging capabilities built-in so a network traffic log may be sent to the factory for analysis if any abnormality in system operation is identified. In step 802, the system simply logs all traffic on the network and monitors any abnormalities in system operation. In step 804, the system determines if any abnormalities which need to be reported exist on the system. If a reportable abnormality is detected in step 804, the system reports this abnormality in step 806 and continues to monitor network traffic for abnormalities. Although FIG. 8 indicates that the abnormalities are reported to a factory, the abnormalities may also (or alternatively) be reported to other locations, such as directly to the user of the simulator.

Although the description provided herein is made with exemplary reference to fire safety systems, it will be recognized that the simulator system may be applied to other systems of various types in order to allow for increase productivity and risk reduction. Other examples of systems which may benefit from the method and simulator described herein include but are not limited to building automation equipment and other related smart building technologies. It will be recognized that the specifics of how the simulation is interfaced and data acquired would be unique to these other systems.

Furthermore, although the method and system for testing a building control system has been described with respect to certain preferred embodiments, it will be appreciated by those of skill in the art that other implementations and adaptations not described herein are possible. Moreover, there are advantages to individual advancements described herein that may be obtained without incorporating other aspects described above. Therefore, the spirit and scope of the appended claims should not be limited to the description of the embodiments contained herein.

What is claimed is:

1. A method of testing a building control system being installed in a facility, the building control system comprising a plurality of building control devices, the method comprising:
   a) providing a network including at least one computer operatively connected to at least one control panel at the facility, the at least one computer configured to run a simulator program;
   b) installing a first portion of the plurality of building control devices at the facility while a second portion of the plurality of building control devices remain uninstalled at the facility;
   c) delivering identification information concerning the plurality of building control devices to the simulator program, wherein the identification information is based on a facility specific configuration database generated by a configuration tool used to design a facility specific building control system configuration;
   d) providing a reference file for instructing the simulator program to simulate the second portion of the plurality of building control devices and to not simulate the first portion of the plurality of building control devices; and
   e) simulating a performance of the second portion of the plurality of building control devices which remain uninstalled at the facility using the simulation program, but not simulating a performance of the first portion of the plurality of building control devices which are installed at the facility.

2. The method of claim 1 wherein the building control system comprises a fire safety system and the at least one control panel comprises a fire control panel.

3. The method of claim 2 wherein the building control devices comprise smoke detectors, audible alarms, and pull handles.

4. The method of claim 1 wherein at least one of the first portion of the plurality of building control devices is connected to the at least one control panel.

5. The method of claim 1 wherein the step of delivering identification information concerning the plurality of building control devices to the simulator program comprises manipulating the configuration database to generate a second version of the configuration database for the simulator program.

6. The method of claim 1 wherein the simulator program communicates with the first plurality of building control devices which are installed at the facility during the step of simulating.

7. The method of claim 1 wherein the step of simulating the performance of the second portion of the plurality of building control devices which remain uninstalled at the facility using the simulation program comprises providing a graphical user interface configured to allow a user to select one of the uninstalled building control devices and modify the parameters of the selected uninstalled building control device.

8. The method of claim 7 wherein the parameters of the selected uninstalled building control device comprise input or output parameters.

9. A method of testing a building control system at a facility, the building control system comprising a plurality of building control devices, the method comprising:
   a) communicating with a plurality of installed building control devices, the installed building control devices installed at the facility;
   b) simulating an operation of a plurality of uninstalled building control devices, the uninstalled building control devices not installed at the facility wherein the simulation is based on a reference file for simulating the uninstalled building control devices and for not simulating the installed building control devices;
   c) analyzing a performance of the building control system based on a performance of the installed building control devices during step a) and uninstalled building control devices during step b);
   d) receiving a facility specific configuration database of the plurality of building control devices wherein the facility specific configuration database is generated by a configuration tool used to design a facility specific building control system configuration;
   e) manipulating the configuration database to generate a second version of the configuration database for use by a simulator program; and
   f) providing an indication of which of the plurality of building control devices are uninstalled, wherein steps d), e) and f) are performed before step b).

10. The method of claim 9 wherein the building control system comprises a fire safety system.

11. The method of claim 9 wherein the building control devices comprise smoke detectors, audible alarms, and pull handles.

12. The method of claim 9 wherein the plurality of building control devices are connected to at least one control panel which is connected to a network.

13. A building control system comprising:
   a) a central control station;
   b) at least one control panel connected to the central control station over a network;
   c) at least one building control device loop connected to at least one control panel, the at least one control device loop comprising a plurality of installed building control devices connected in an electrical circuit; and
   d) a simulator connected to the network and configured to simulate an operation of a plurality of uninstalled building control devices for the building control system, the simulator configured to communicate over the network with the plurality of installed building control devices and to receive identification information concerning the building control devices wherein the identification information is based on a facility specific configuration database generated by a configuration tool used to design a facility specific building system configuration while also simulating the operation of the plurality of uninstalled building control devices
   wherein the simulator is instructed by a reference file to simulate the uninstalled building control devices and to not simulate the installed building control devices.

14. The building control system of claim 13 wherein the building control system comprises a fire safety system.

15. The building control system of claim 14 wherein the plurality of installed building control devices comprise smoke detectors, audible alarms, and pull handles.

16. The building control system of claim 14 wherein the plurality of uninstalled building control devices comprise smoke detectors, audible alarms, and pull handles.

17. The building control system of claim 13 wherein the simulator is provided on the central control station.

* * * * *